(12) United States Patent
Ono et al.

(10) Patent No.: US 8,314,485 B2
(45) Date of Patent: Nov. 20, 2012

(54) ELECTRONIC COMPONENT

(75) Inventors: Kazuyuki Ono, Anjo (JP); Yoshio Tanaka, Koka (JP); Kiyoshi Nakajima, Higashiomi (JP); Naoto Kuratani, Kameoka (JP); Tomofumi Maekawa, Osaka (JP)

(73) Assignee: OMRON Corporation, Kyoto (JP)

( * ) Notice: Subject to any disclaimer, the term of this patent is extended or adjusted under 35 U.S.C. 154(b) by 194 days.

(21) Appl. No.: 12/673,098

(22) PCT Filed: Feb. 16, 2009

(86) PCT No.: PCT/JP2009/000608
§ 371 (c)(1),
(2), (4) Date: Apr. 6, 2010

(87) PCT Pub. No.: WO2010/001503
PCT Pub. Date: Jan. 7, 2010

(65) Prior Publication Data
US 2010/0200983 A1 Aug. 12, 2010

(30) Foreign Application Priority Data
Jul. 1, 2008 (JP) .................... 2008-172109

(51) Int. Cl.
*H01L 23/04* (2006.01)
(52) U.S. Cl. ............. 257/708; 257/659; 257/E23.181
(58) Field of Classification Search ............ 257/708, 257/E23.181, 704, 659, 660, E23, 181
See application file for complete search history.

(56) References Cited

U.S. PATENT DOCUMENTS

| 6,225,694 | B1 * | 5/2001 | Terui ............................ 257/704 |
| 6,713,417 | B2 * | 3/2004 | Chikagawa et al. ........... 501/32 |
| 7,436,679 | B2 * | 10/2008 | Iijima et al. .................. 361/760 |
| 7,656,047 | B2 * | 2/2010 | Yang et al. ................... 257/787 |

FOREIGN PATENT DOCUMENTS

| JP | 62-149155 A | 7/1987 |
| JP | 2002-110833 A | 4/2002 |
| JP | 2002-134639 A | 5/2002 |
| JP | 2004-064013 A | 2/2004 |
| JP | 3743427 | 2/2006 |
| JP | 2006-059872 A | 3/2006 |

OTHER PUBLICATIONS

Chinese Office Action for Chinese Application No. 2009801002317, mailed on Feb. 25, 2011, and English translation thereof (6 pages).
International Search Report issued in PCT/JP2009/000608, mailed on May 19, 2009, with translation, 4 pages.

* cited by examiner

*Primary Examiner* — Roy Potter
(74) *Attorney, Agent, or Firm* — Osha Liang LLP

(57) ABSTRACT

An electronic component has a board, a semiconductor element mounted on an upper surface of the board, a ground electrode formed in a region surrounding the semiconductor element on the upper surface of the board, a conductive cap that overlaps the board such that the semiconductor element is covered therewith, and a conductive joining member that joins a whole periphery of a lower surface of the conductive cap to the ground electrode. The conductive cap includes a pressing portion on the lower surface thereof. The lower surface of the conductive cap and the ground electrode are joined by the conductive joining member on an outer peripheral side of the pressing portion.

5 Claims, 22 Drawing Sheets

US 8,314,485 B2

ELECTRONIC COMPONENT

TECHNICAL FIELD

The present invention relates to an electronic component, particularly to an electronic component in which a semiconductor element such as a sensor chip and an electronic circuit are accommodated in a package.

BACKGROUND ART

For example, Patent Document 1 discloses an electronic component in which a semiconductor element is accommodated in a high-frequency package. FIG. 1 is an exploded perspective view of an electronic component 11 disclosed in Patent Document 1, and FIG. 2 is a sectional view of the electronic component 11 of Patent Document 1. In the electronic component 11, a portion above a semiconductor element 13 mounted on an upper surface of a board 12 is covered with a metallic cap 14. The semiconductor element 13 mounted on the upper surface of the board 12 is connected to a pad 16 through a bonding wire 15, and the pad 16 is connected to a lead electrode 18 in a rear surface through a via hole 22. A ring-like ground electrode 19 is provided in an outer peripheral portion in the upper surface of the board 12 so as to surround the circuit region, and the ground electrode 19 is connected to a ground pattern 20 in the rear surface of the board 12 through a via hole 17. The metallic cap 14 is bonded to the ground electrode 19 by a conductive resin bonding agent 21, and the metallic cap 14 is electrically connected to the ground electrode 19 while mechanically fixed to the ground electrode 19. The ground electrode 19 to which the metallic cap 14 is connected is provided in the upper surface of the board 12, thereby preventing a harmful influence of an electronic capacitance C between the lead electrode 18 and the metallic cap 14 on a circuit function.

However, in the electronic component 11 having the structure of Patent Document 1, the conductive resin bonding agent 21 flows out to the inside, and occasionally the conductive resin bonding agent 21 short-circuits the semiconductor element 13. That is, in fixing the metallic cap 14 to the board 12, the conductive resin bonding agent 21 ejected from a syringe is applied along the ground electrode 19, the metallic cap 14 overlaps the board 12 such that the conductive resin bonding agent 21 is sandwiched between the ground electrode 19 and the outer-peripheral-portion lower surface of the metallic cap 14, and the metallic cap 14 is held down. Therefore, when the metallic cap 14 is held down on the ground electrode 19, the conductive resin bonding agent 21 is pushed out from between the ground electrode 19 and the metallic cap 14, and the conductive resin bonding agent 21 flowing out to the inside possibly comes into contact with a signal input/output pad 16 or a power feeding pad 16. Because the conductive resin bonding agent 21 is in contact with the ground electrode 19 to become a ground potential, unfortunately the conductive resin bonding agent 21 makes a short circuit when coming into contact with the pad 16.

Thus, conventionally sufficient flexibility may be put into a distance between the ground electrode 19 and a region where the semiconductor element 13 or the pad 16 is provided. However, when the distance is increased, eventually a footprint of the electronic component 11 is increased to enlarge a size of the electronic component 11. On the other hand, when the size of the electronic component 11 is decreased, the short circuit is easily made by the conductive resin bonding agent 21. Therefore, there is a trade-off relationship between the miniaturization of the electronic component 11 and the prevention of the short circuit.

In the electronic component 11 having the structure of Patent Document 1, a variation in height of the electronic component 11 is generated by a variation in thickness of the conductive resin bonding agent 21. The metallic cap 14 cannot sufficiently be pressed in bonding the metallic cap 14 because possibly the conductive resin bonding agent 21 flows out to the inside to generate the short circuit when the metallic cap 14 is strongly held down in bonding the metallic cap 14 to the conductive resin bonding agent 21. Therefore, the variation in height of the conductive resin bonding agent 21 is generated. Because the height of the electronic component 11 depends on a total of the thickness of the board 12, the height of the metallic cap 14, and the thickness of the conductive resin bonding agent 21, the height of the electronic component 11 varies when the thickness of the conductive resin bonding agent 21 varies. The large thickness of the conductive resin bonding agent 21 prevents a low-height profile of the electronic component 11. The excessively small thickness of the conductive resin bonding agent 21 may result in degrading of bonding strength by a lack of resin amount or generation of a bubble.

FIG. 3 is a sectional view illustrating an electronic component 31 disclosed in Patent Document 2. In the electronic component 31, a high-frequency semiconductor element 34 is mounted on an island portion 33 provided in an upper surface of the board 32, and the island portion 33 is connected to a lead electrode 36 in a rear surface through a via hole 35. An electrode of the semiconductor element 34 is connected to a pad 38 on the board 32 through a bonding wire 37, and the pad 38 is connected to a lead electrode 40 in the rear surface through a via hole 39. A groove portion 41 is provided in the outer peripheral portion in the upper surface of the board 32 by cutting with a dicing blade, and a resin reservoir 43 is formed between the groove portion 41 and the resin cap 42 when the resin cap 42 overlaps the groove portion 41. Therefore, when the lower surface of the resin cap 42 and the groove portion 41 are bonded by a bonding resin 44, the excess bonding resin 44 is retained by the resin reservoir 43, thereby preventing the bonding resin 44 from flowing out onto the side of the semiconductor element 34.

However, in the electronic component 31 having the above-described structure, it is necessary that the board 32 be mechanically cut with the dicing blade to prepare the groove portion 41, which results in cost increase. Because the groove portion 41 is provided after the board 32 is prepared, it is difficult to provide a conductive pattern in the groove portion 41 that is of the bonding portion. Therefore, the electronic component 31 is not suitable to the joining associated with electric conduction between the metallic cap and the conductive pattern (ground electrode) of the board. Further, unfortunately the variation in height of the electronic component 31 is increased by a variation in mechanical cutting of the groove portion 41.

Patent Document 1: Japanese Unexamined Patent Publication No. 2002-134639
Patent Document 2: Japanese Unexamined Patent Publication No. 2002-110833

SUMMARY OF INVENTION

One or more embodiments of the invention provides an electronic component in which the variation in height can be decreased while the conductive bonding resin is prevented from flowing out to the inside by inexpensive means in the electronic component in which the conductive cap is joined to the ground electrode provided in the board by the conductive joining member to form the semiconductor element package.

In accordance with one aspect of the present invention, there is provided an electronic component in which a semiconductor element is mounted on an upper surface of a board, a ground electrode is formed in a region surrounding the semiconductor element on the upper surface of the board, a conductive cap overlaps the board such that the semiconductor element is covered therewith, and a whole periphery of a lower surface of the conductive cap is joined to the ground electrode by a conductive joining member, wherein the conductive cap includes a pressing portion in part of the lower surface thereof, and the lower surface of the conductive cap and the ground electrode are joined by the conductive joining member on an outer peripheral side of the pressing portion.

In the electronic component of the above aspect of the invention, the semiconductor element mounted on the upper surface of the board is covered with the package including the board and the conductive cap to establish the electric conduction between the conductive cap and the ground electrode, so that the internal semiconductor element can be shielded from the external high-frequency noise. The pressing portion is provided in part of the lower surface of the conductive cap, the lower surface of the conductive cap and the ground electrode are joined by the conductive joining member on the outer peripheral side rather than in the pressing portion. Therefore, the conductive joining member between the lower surface of the conductive cap and the ground electrode is blocked by the pressing portion of the conductive cap, and the conductive joining member does not further flow inside, or the conductive joining member is suppressed to a small amount even if the conductive joining member crosses over the pressing portion to flow inside. Accordingly, the conductive joining member can be prevented from invading in the inside beyond the ground electrode to short-circuit the internal circuit. The conductive cap is sufficiently pushed on the board, so that the height of the electronic component can substantially be determined the total of the thickness of the board and the height of the conductive cap to reduce the variation in height of the electronic component.

In the above aspect, part of the ground electrode is coated with a coating member such as a solder resist or a silk pattern, part of the ground electrode is exposed from the coating member on the outer peripheral side of the region coated with the coating member, and the pressing portion is provided in an upper surface of the coating member. Accordingly, the thickness of the conductive joining member between the lower surface of the conductive cap and the ground electrode can be increased by the thickness of the coating member compared with the case in which the pressing portion is provided in the upper surface of the ground electrode, and the conductive cap can securely and firmly be joined to the ground electrode.

In the above aspect, the lower surface of the conductive cap is sunk in upward further than the pressing portion on the outer peripheral side of the pressing portion of the conductive cap lower surface. Accordingly, the thickness of the conductive joining member between the lower surface of the conductive cap and the ground electrode can be increased by the recessed lower surface of the conductive cap, and the conductive cap can securely and firmly be joined to the ground electrode.

In the above aspect, a gap between the lower surface of the conductive cap and the ground electrode is gradually increased toward the outer peripheral side of the pressing portion. Accordingly, the thickness of the conductive joining member between the lower surface of the conductive cap and the ground electrode can be increased by the gradually-increased gap between the lower surface of the conductive cap and the ground electrode, and the conductive cap can securely and firmly be joined to the ground electrode.

In one or more embodiments of the invention, the pressing portion may be provided in the upper surface of the ground electrode. In one or more embodiments of the invention, the lower surface of the conductive cap is recessed, or the gap between the lower surface of the conductive cap and the ground electrode is gradually increased. Therefore, even if the pressing portion is provided in the upper surface of the ground electrode, the space can be obtained in order to retain the conductive joining member between the lower surface of the conductive cap and the ground electrode.

Other aspects and advantages of the invention will be apparent from the following description and the appended claims.

Figure 1:
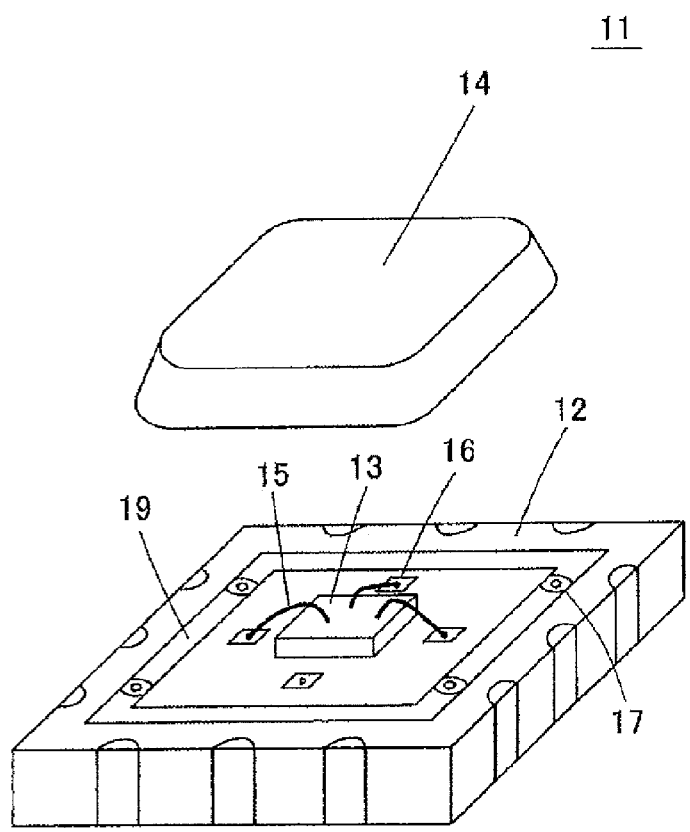
FIG. 1 is an exploded perspective view of an electronic component disclosed in Patent Document 1.
Figure 2:
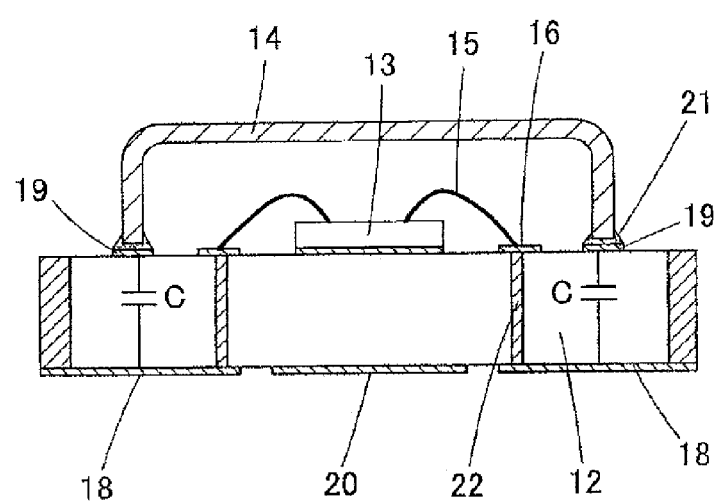
FIG. 2 is a sectional view of the electronic component of Patent Document 1.
Figure 3:
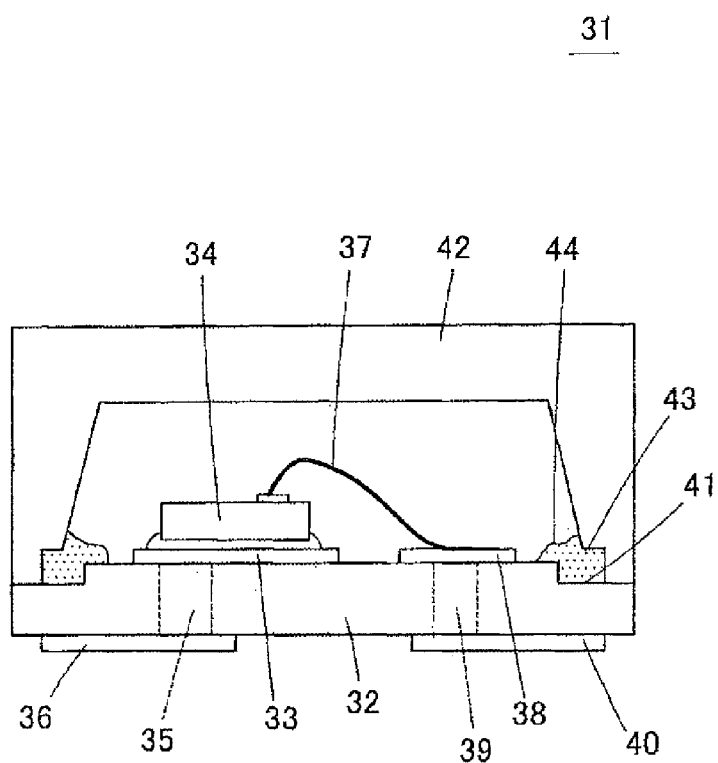
FIG. 3 is a sectional view of an electronic component disclosed in Patent Document 2.

DESCRIPTION OF SYMBOLS 51 electronic component
52 board
63 semiconductor element
54 conductive cap
55 island portion
57 ground electrode
59 lead electrode
67 solder resist
68 die bonding resin
69 bonding wire
70 flange
71 recess
72 pressing portion
73 conductive joining member
81 electronic component
82 plating layer

DETAILED DESCRIPTION

Preferred embodiments of the invention will be described with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(First Embodiment)

Figure 4:
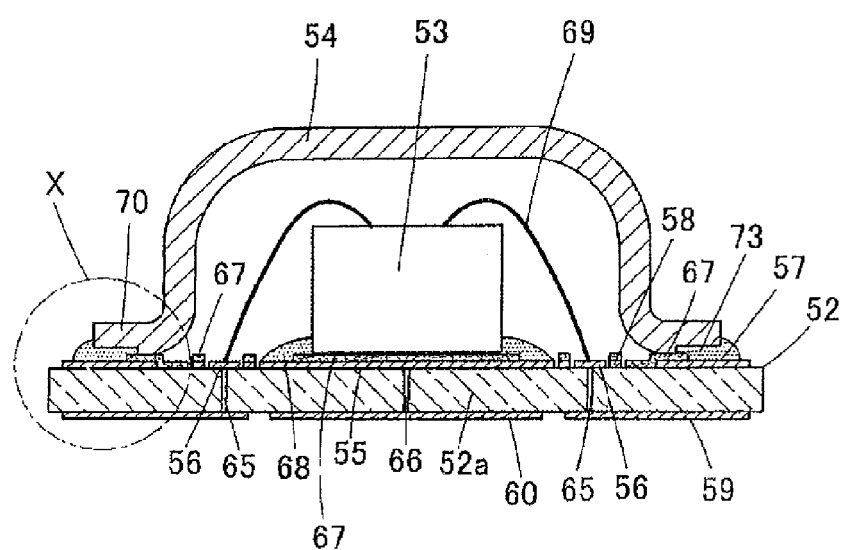
FIG. 4 is a sectional view illustrating a structure of an electronic component according to a first embodiment of the invention.
Figure 5:
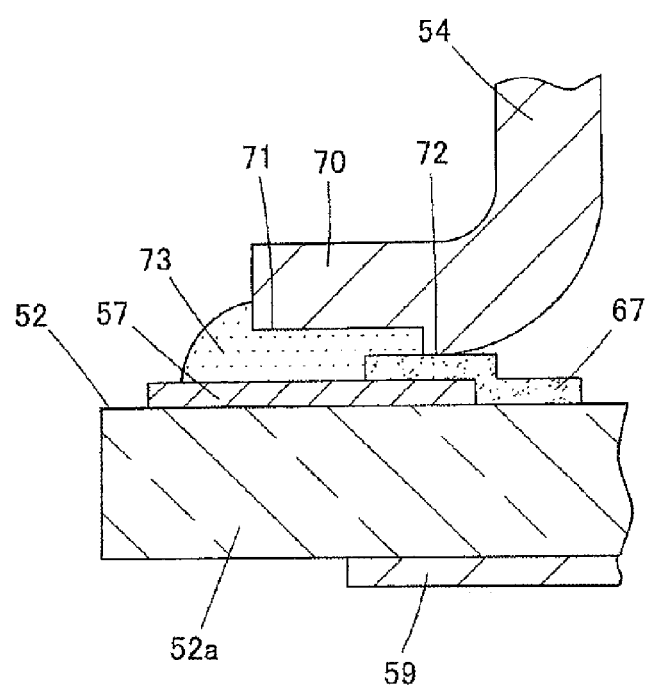
FIG. 5 is an enlarged view of an X portion of FIG. 4.
Figure 6:
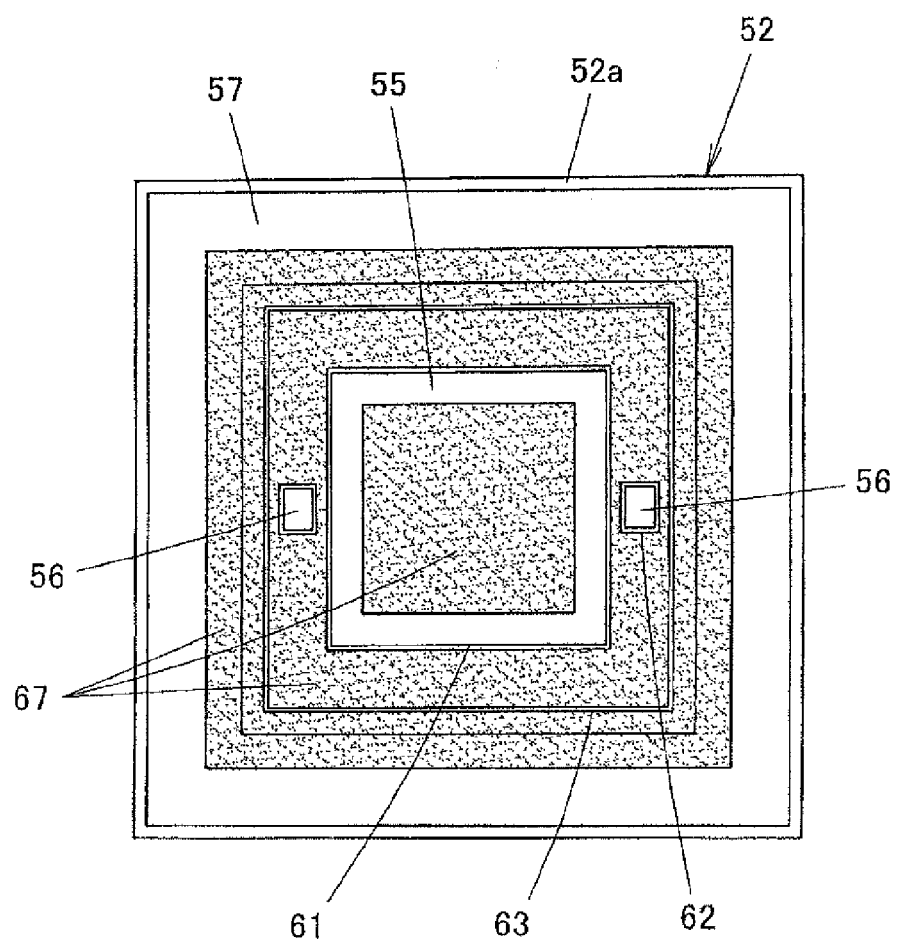
FIG. 6 is a plan view illustrating a board of the electronic component.
Figure 7:
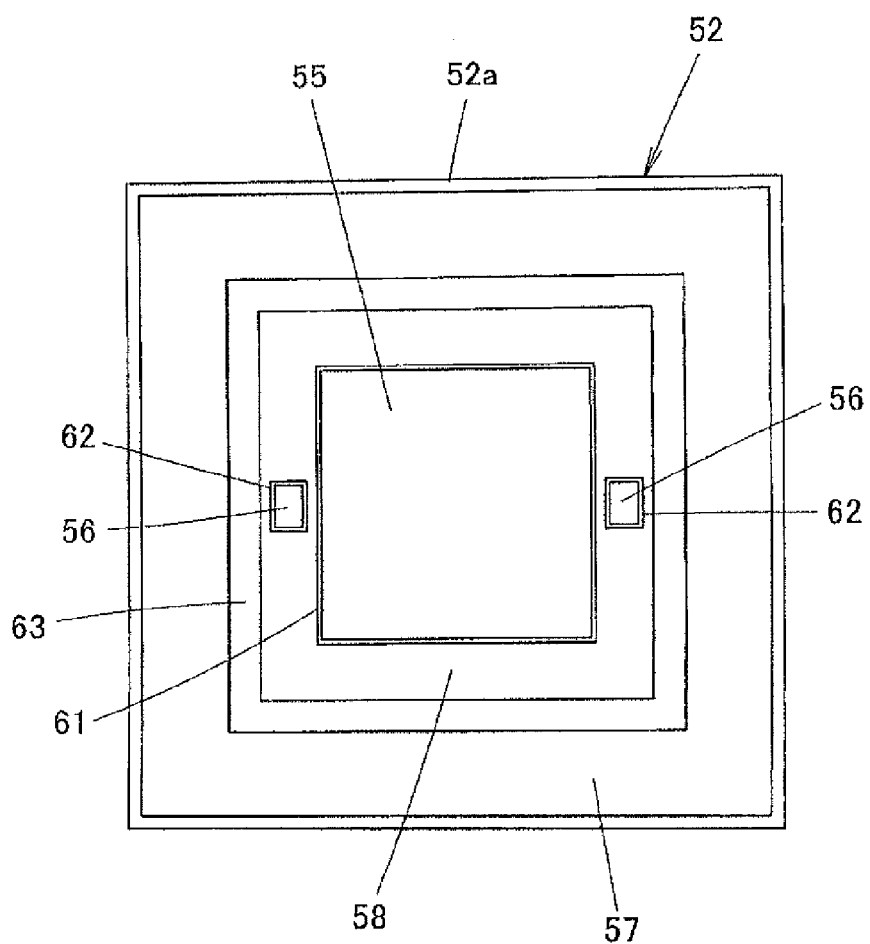
FIG. 7 is a plan view of a state in which a solder resist is removed from the board.
Figure 8:
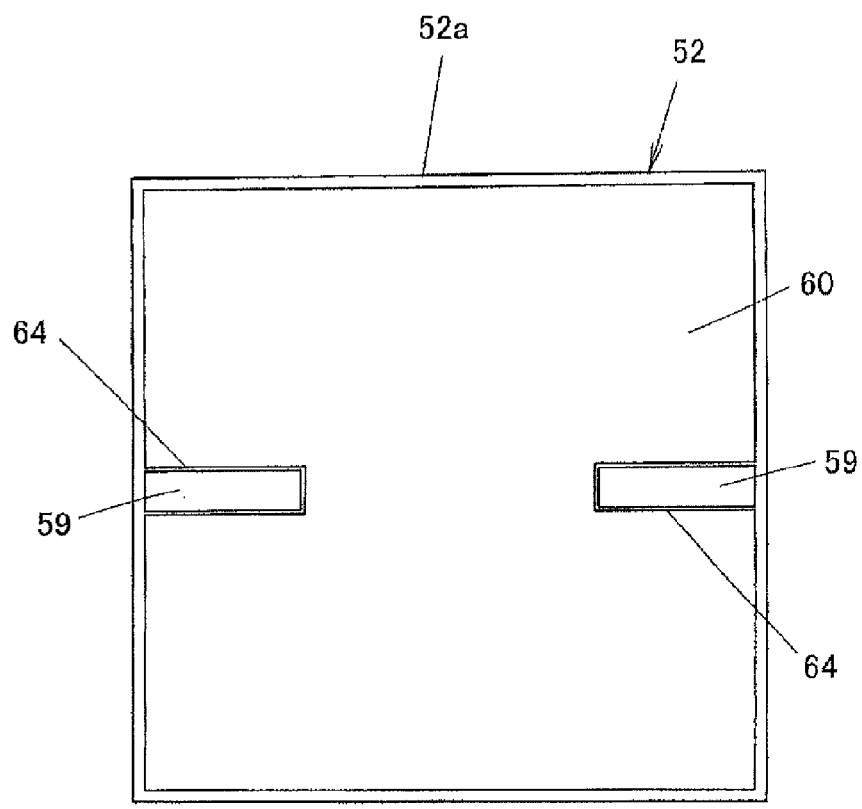
FIG. 8 is a bottom view of the board of the electronic component.

FIG. 4 is a sectional view illustrating a structure of an electronic component according to a first embodiment of the invention, and FIG. 5 is an enlarged view of an X portion of FIG. 4. FIG. 6 is a plan view of a board of the electronic component, FIG. 7 is a plan view of the board in the state in which a solder resist (coating member) is removed, and FIG. 8 is a bottom view of the board. In an electronic component 51, a semiconductor element 53 is mounted on an upper surface of a board 52, and the semiconductor element 53 is accommodated in a package (Faraday cage) including the board 52 and a conductive cap 54.

The board 52 is formed by a printed board. As illustrated in FIG. 7, a metallic thin film that is made of Cu or the like and is bonded to an upper surface of an insulating plate 52a is patterned in an upper surface of the board 52, thereby forming an island portion 55, a pad 56, and a ground electrode 57. The ground electrode 57 is formed in an outer peripheral portion of the board 52 so as to surround the island portion 55 and the pad 56, and the pad 56 is disposed near the island portion 55. In a region of the ground electrode 57, a surface-side ground pattern 58 is formed in a region where the island portion 55 or the pad 56 does not exist. The island portion 55, the pad 56, the ground electrode 57, and the surface-side ground pattern 58 are separated from one another by grooves 61, 62, and 63.

As illustrated in FIG. 6, a region except the outer peripheral portion of the island portion 55 is coated with a solder resist 67 in order to protect a surface of the metallic thin film. The surface of the surface-side ground pattern 58 is also coated with the solder resist 67. The solder resist 67 is also formed in a region from an inner peripheral portion of the ground electrode 57 to a portion in which the insulating plate 52a in the groove 63 is exposed. For example, for the ground electrode 57 having a width of 0.25 mm, a range of the width of 0.10 mm in the inner peripheral portion of the ground electrode 57 is coated with the solder resist 67. After the solder resist 67 is applied to the surface of the board 52 with an even thickness by screen print of the solder resist in a melted state, the solder resist 67 is cured by heating. In the first embodiment, the solder resist is used as the coating member. Alternatively, for example, a silk pattern may be used.

As illustrated in FIG. 8, in the lower surface of the board 52, a lead electrode 59 and a rear-surface-side ground pattern 60 are formed by patterning the metallic thin film that is made of Cu or the like and is bonded to the lower surface of the lower surface of the insulating plate 52a. The lead electrode 59 and the rear-surface-side ground pattern 60 are separated from each other by a groove 64. The lead electrode 59 and the rear-surface-side ground pattern 60 are patterns used to solder-mount the electronic component 51 on the board (for example, mother board for mobile telephone).

As illustrated in FIG. 4, a via hole is made in the insulating plate 52a so as to penetrate from the surface to the rear surface, the pad 56 is electrically connected to the lead electrode 59 through a via hole 65, and the island portion 55 and the ground electrode 57 are connected to the rear-surface-side ground pattern 60 through a via hole 66. The surface-side ground pattern 58 may be connected to the rear-surface-side ground pattern 60 through the via hole, the surface-side ground pattern 58 may electrically float from the ground, or the surface-side ground pattern 58 may be eliminated. However, desirably the surface-side ground pattern 58 is provided because warpage of the board 52 can be prevented by substantially equalizing areas of the surface and rear surface of the metallic thin film.

For example, the semiconductor element 53 is an element such as a sensor chip for various kinds of sensing, LSI, and ASIC, and the semiconductor element 53 is bonded and fixed onto the island portion 55 and the solder resist 67 in the upper surface by a die bonding resin 68. Bonding resin such as silicone and epoxy is used as the die bonding resin 68, and the die bonding resin 68 blocks an excessive force from an environment. A terminal of the semiconductor element 53 and the pad 56 are connected through a bonding wire 69, and therefore the electric conduction is established between the terminal of the semiconductor element 53 and the lead electrode 59 in the lower surface. Plural semiconductor elements may be mounted on the upper surface of the board 52, or other electric/electronic components may be mounted on the upper surface of the board 52. The pattern of the metallic thin film can freely be designed as appropriate according to a shape of the mounted semiconductor element or electric/electronic component.

The conductive cap 54 made of a metallic material having a small specific resistance is formed into a cap shape, and a space is formed in the lower surface of the conductive cap 54 in order to accommodate the semiconductor element 53 and the like. A flange 70 that is substantially horizontally extended is formed in the whole periphery of the lower end portion of the conductive cap 54. A recess 71 is provided in the whole periphery on the leading end side in the lower surface of the flange 70, and a projected pressing portion 72 is formed in the whole periphery at the back (inside of conductive cap 54) of the recess 71 in the lower surface of the flange 70.

The conductive cap 54 is produced by pressing of a metallic plate, and the recess 71 is simultaneously formed in the pressing. Therefore, the recess 71 can be formed at low cost with a small dimensional variation compared with the case in which the recess 71 is formed by the cutting.

The conductive cap 54 is placed on the board 52 such that the semiconductor element 53 and the like are covered therewith. The pressing portion 72 in the lower surface of the flange 70 abuts on the solder resist 67 on the ground electrode 57 over the whole periphery. A space among the recess 71 of the flange 70, the ground electrode 57, and the solder resist 67 is filled with a conductive joining member 73, the conductive cap 54 is joined and fixed to the ground electrode 57 by the conductive joining member 73, and the conductive cap 54 is electrically connected to the ground electrode 57 by a conductive property of the conductive joining member 73 to become the same potential (ground potential) as the rear-surface-side ground pattern 60 in the lower surface. A material such as conductive epoxy resin (for example, epoxy resin containing silver filler), solder and the like is used as the conductive joining member 73.

In the electronic component 51, the Faraday cage is formed by the board 52 including the conductive cap 54 connected to the ground and the rear-surface-side ground pattern 60 connected to the ground, so that the high-frequency noise can be blocked from the outside to reduce the influence of the external noise on the semiconductor element 53. The package may have a sealed structure according to the kind of the accommodated semiconductor element 53, or the package need not have the sealed structure. For example, when a humidity resistance or a chemical resistance is required, desirably the package has the sealed structure. When dust or light is blocked from the outside, it is only necessary to cover the semiconductor element 53 with the package, and it is not always necessary to establish the airtightness. When an acoustic sensor is mounted as the semiconductor element 53, a hole may be made in a top portion or the like of the conductive cap 54 in order to pass acoustic vibration.

Occasionally, in the conductive joining member 73, a hole is generated by a void and the like to an extent in which the outside and inside of the package are communicated with each other. However, in the first embodiment, the conductive cap 54 and the board 52 are in direct contact with each other, and a secure joining member reservoir (fillet) is formed on the outer peripheral side of the conductive cap 54 and the board 52, so that the ventilation can be blocked in the joining portion between the conductive cap 54 and the board 52. Therefore, when the airtightness is added to the package, the airtightness can be improved.

As illustrated in FIG. 5, in the electronic component 51, the pressing portion 72 in the lower surface of the flange 70 abuts on the solder resist 67, and the pressing portion 72 and the solder resist 67 become a wall inside the conductive joining member 73. Therefore, the conductive joining member 73 in the melted state can be prevented from flowing inside in joining the conductive cap 54, and the generation of the short circuit can be prevented. The conductive joining member 73 flowing inside comes into contact with a circuit portion such as the pad 56 to make the short circuit. The thickness of the space filled with the conductive joining member 73 becomes the sum of the thickness of the solder resist 67 and the thickness of the recess 71. Therefore, the thickness of the conductive joining member 73 can be gained to perform the joining by the sufficient amount of conductive joining member 73, and the generation of the bubble can be prevented to firmly join the conductive cap 54 to the board 52. Because the pressing portion 72 of the flange 70 directly abuts on the upper surface of the solder resist 67, the height of the electronic component 51 is determined by the thickness of the board 52 and the height of the conductive cap 54 irrespective of the thickness of the conductive joining member 73, and the thickness of the solder resist 67 can accurately be controlled by a screen thickness during the screen print. Therefore, variation in height of the electronic component 51 can be reduced to obtain height accuracy of the electronic component 51.

The reason part of the ground electrode 57 is exposed from the solder resist 67 is that the electric conduction is established between the ground electrode 57 and the conductive cap 54 by the conductive joining member 73. Because the conductive joining member 73 has a small wet angle with respect to the solder resist 67, possibly the conductive joining member 73 flows out onto the outer peripheral side of the conductive joining member 73 when even the end of the outside of the ground electrode 57 is coated with the solder resist 67. Because the conductive joining member 73 has the wet angle higher than that of the solder resist 67 with respect to the ground electrode 57 (inorganic material), when the outer peripheral side of the ground electrode 57 is exposed from the solder resist 67 in the first embodiment, the conductive joining member 73 hardly leaks onto the outer peripheral side of the ground electrode 57.

Figure 9:
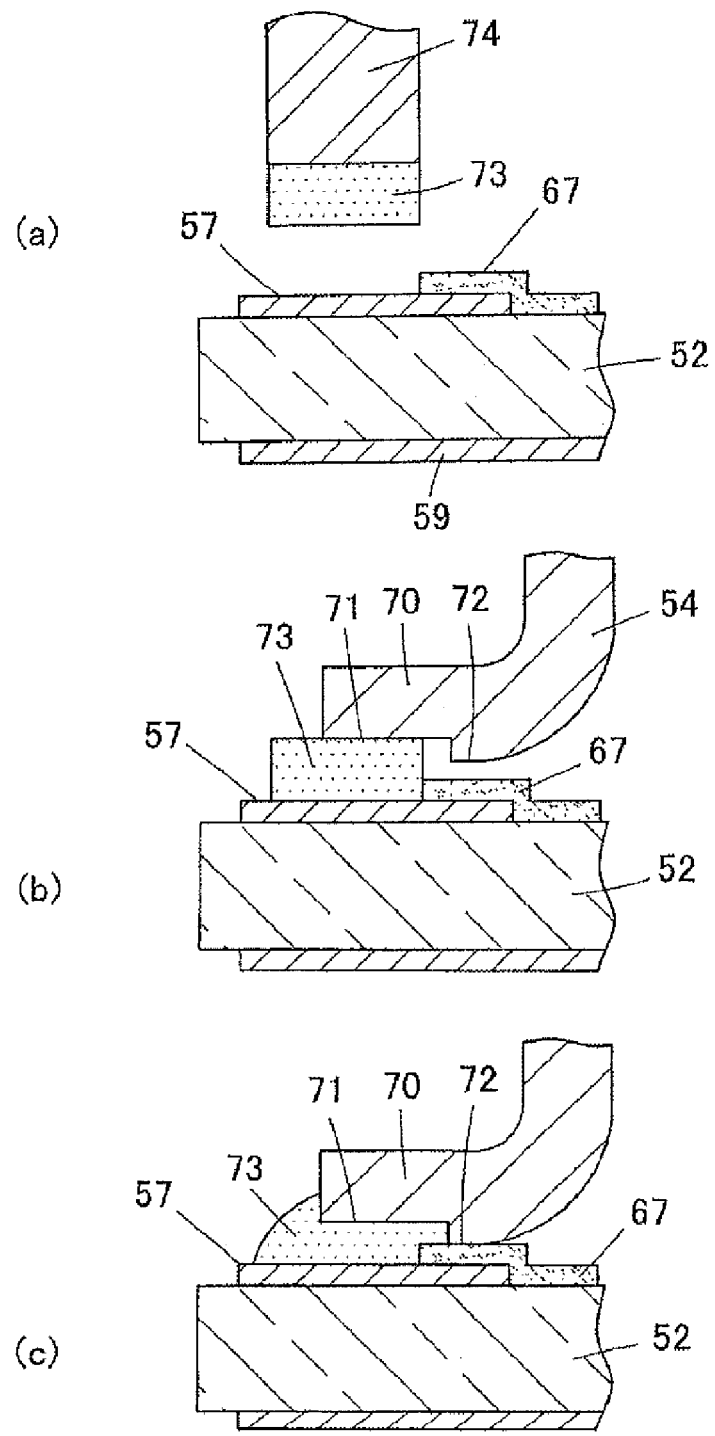
FIG. 9 is a sectional view for explaining a method for applying conductive bonding resin.

FIG. 9 is a sectional view for explaining a method for joining the conductive cap 54 to the board 52 to assemble the electronic component 51. A stamper 74 (transfer pin) whose part is illustrated in FIG. 9(a) is formed into a ring shape or a cylindrical shape according to the shape of the ground electrode 57. After the conductive joining member 73 is applied to the lower surface of the stamper 74 as illustrated in FIG. 9(a), the stamper 74 is pushed down on a region that is not coated with the solder resist 67 of the ground electrode 57, thereby transferring the conductive joining member 73 to the region. Then, the conductive cap 54 overlaps the board 52 while the flange 70 is aligned with the ground electrode 57, the conductive joining member 73 is pushed by the recess 71 as illustrated in FIG. 9(b), and the pressing portion 72 abuts on the upper surface of the solder resist 67 as illustrated in FIG. 9(c). At this point, the conductive joining member 73 is pushed by the flange 70 and spread in the space between the recess 71 and the ground electrode 57. However, because the end inside the space is closed by the wall formed by the pressing portion 72 and the solder resist 67, the conductive joining member 73 does not flow inside the conductive cap 54.

The conductive joining member 73 may be applied along the ground electrode 57 by a syringe.

(Modification of First Embodiment)

Figure 10:
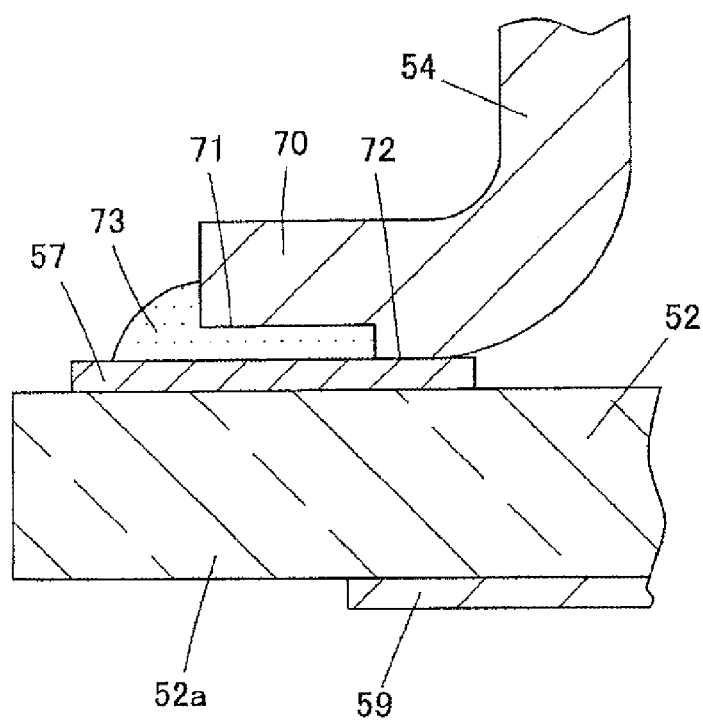
FIG. 10 is a sectional view illustrating part of an electronic component according to a modification of the first embodiment.

FIG. 10 is a sectional view illustrating part of an electronic component according to a modification of the first embodiment. In the modification, the solder resist 67 which covers the lead electrode 59 is removed, and the pressing portion 72 of the flange 70 abuts on the surface of the lead electrode 59. In the modification, the thickness of the conductive joining member 73 with which the space between the flange 70 and the lead electrode 59 is filled is equal to the height of the recess 71 and slightly lower than that of the first embodiment. The conductive joining member 73 with which the space between the flange 70 and the lead electrode 59 is filled does not flow inside the conductive cap 54 because the pressing portion 72 located inside the conductive joining member 73 constitutes the wall.

In the first embodiment, the surface exposed from the solder resist 67 of the lead electrode 59 may be coated with a plating layer such as Au plating. In the modification, the surface of the lead electrode 59 may also be coated with the plating layer such as Au plating.

(Second Embodiment)

Figure 11:
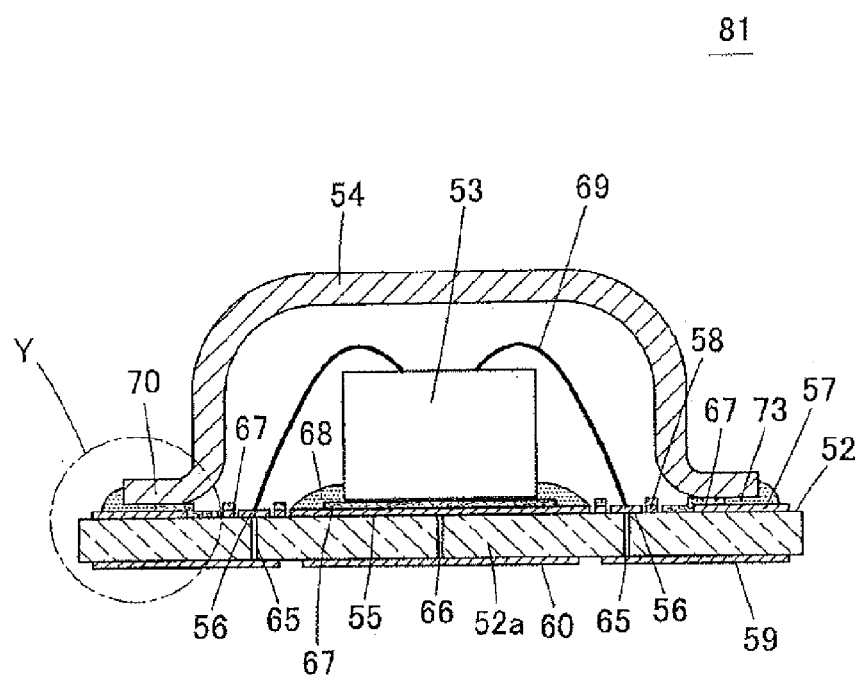
FIG. 11 is a sectional view illustrating a structure of an electronic component according to a second embodiment of the invention.
Figure 12:
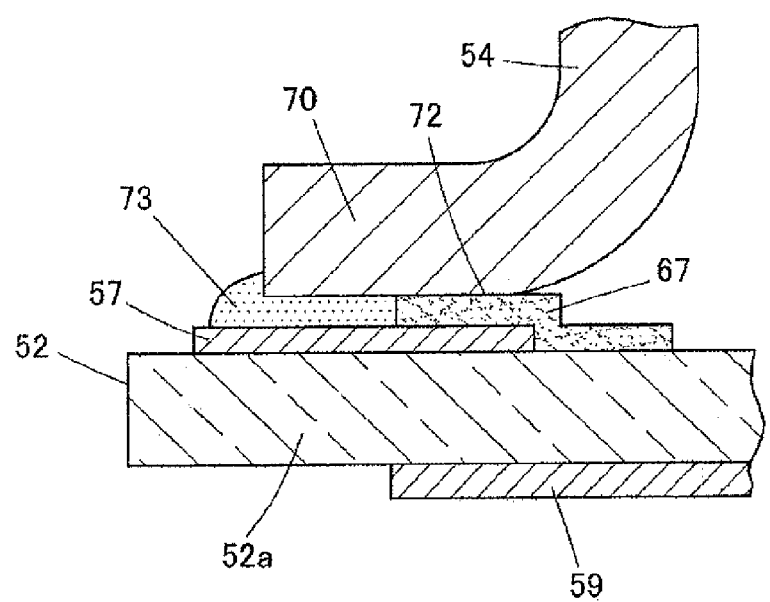
FIG. 12 is an enlarged view of a Y portion of FIG. 11.

FIG. 11 is a sectional view illustrating a structure of an electronic component according to a second embodiment of the invention. FIG. 12 is an enlarged view of a Y portion of FIG. 11. An electronic component 81 of the second embodiment differs from the electronic component 51 of the first embodiment in that the recess 71 is not provided in the flange 70 of the conductive cap 54 and the pressing portion 72 is flat.

In the electronic component 81 of the second embodiment, the neighborhood of the curvature portion in the lower surface of the flange 70 constitutes the pressing portion 72, the pressing portion 72 abuts on the upper surface of the solder resist 67, and the conductive cap 54 is electrically connected to the ground electrode 57 while joined to the ground electrode 57 by the conductive joining member 73 sandwiched between the flange 70 and the ground electrode 57.

Therefore, in the configuration of the second embodiment, the thickness (about 20 μm) of the conductive joining member 73 is substantially equal to that of the solder resist 67 and slightly lower than that of the first embodiment. However, even in such cases, on the inside of the solder resist 67, because the end face of the solder resist 67 constitutes the wall to prevent the conductive joining member 73 from flowing into the conductive cap 54, there is no risk of making the short circuit by the conductive joining member 73 flowing into the conductive cap 54. Even in such cases, the flange 70 abuts on the solder resist 67, the height of the electronic component 81 is determined by the thickness of the board 52 and the height of the conductive cap 54 irrespective of the thickness of the conductive joining member 73, so that the variation in height of the electronic component 81 can be reduced.

Figure 13:
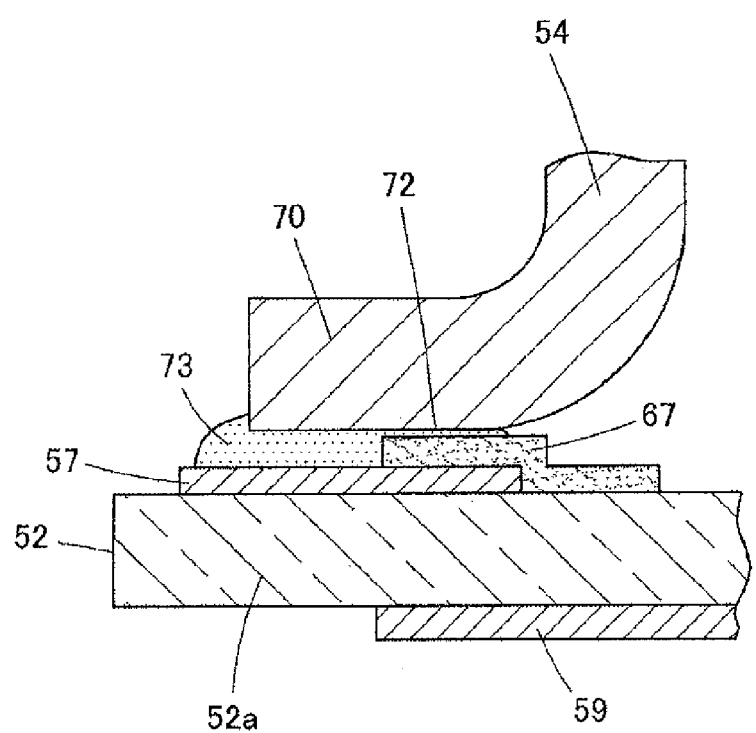
FIG. 13 is a partially sectional view illustrating a different assembly state of the electronic component of the second embodiment.

As illustrated in FIG. 13, in part or the whole of the periphery of the flange 70, occasionally the conductive joining member 73 invades between the pressing portion 72 and the solder resist 67 by a capillary phenomenon depending on how to join the conductive cap 54. At this point, strictly the pressing portion 72 does not abut on the solder resist 67. However, the conductive joining member 73 is applied to the outside of the pressing portion 72, and the pressing portion 72 is sufficiently pressed against the solder resist 67. Even if the conductive joining member 73 invades between the pressing portion 72 and the solder resist 67, the conductive joining member 73 is retained between the pressing portion 72 and the solder resist 67 by a surface tension because of the extremely small thickness. Therefore, there is a small risk that the conductive joining member 73 flows inside to short-circuit the semiconductor element 53 and the like. Even if the conductive joining member 73 invades between the pressing portion 72 and the solder resist 67, because of small risk that the conductive joining member 73 make the short circuit, the conductive cap 54 can sufficiently be pressed against the board 52, and the invading conductive joining member 73 can sufficiently be thinned. Therefore, it can be said that actually the pressing portion 72 abuts on the solder resist 67. In such cases, the variation in height of the electronic component 51 can be reduced (the same holds true for other embodiments such as the first embodiment).

(Modification of Second Embodiment)

Figure 14:
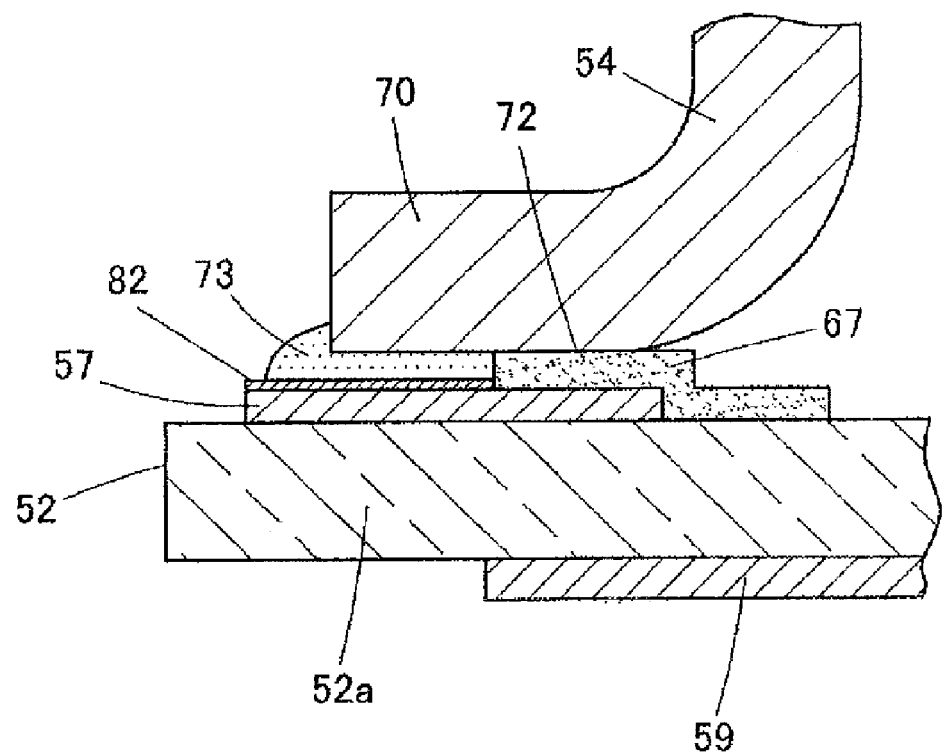
FIG. 14 is a sectional view illustrating part of an electronic component according to a modification of the second embodiment.

FIG. 14 is a sectional view illustrating part of an electronic component according to a modification of the second embodiment. In the modification, in the surface of the ground electrode 57, the region exposed from the solder resist 67 is coated with a plating layer 82 made of stainless metal material such as Au plating in order to protect the ground electrode 57.

(Third Embodiment)

Figure 15:
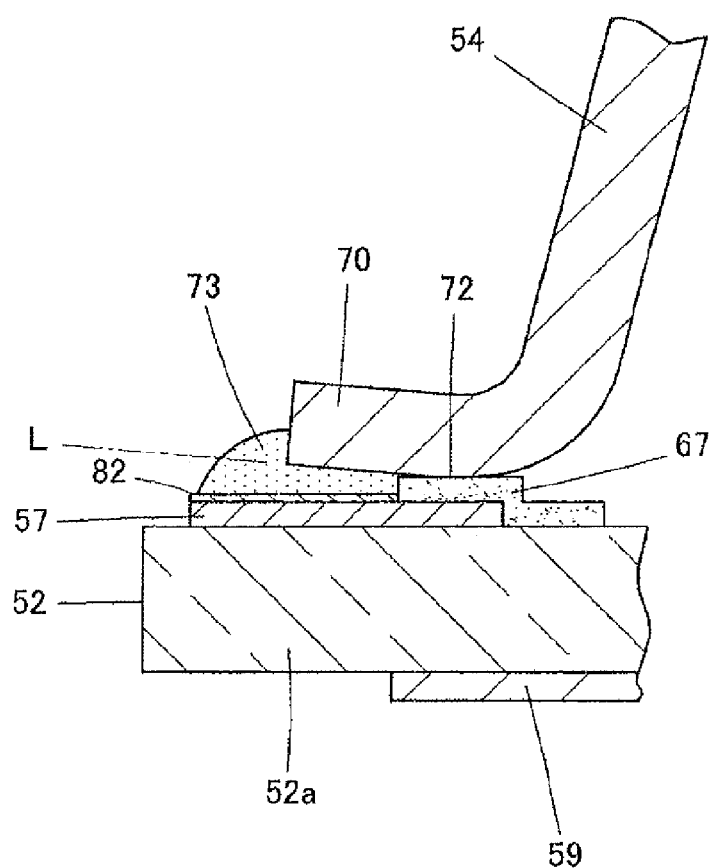
FIG. 15 is a sectional view illustrating a structure of an electronic component according to a third embodiment of the invention.

FIG. 15 is a sectional view illustrating a structure of an electronic component according to a third embodiment of the invention. In the electronic component of the third embodiment, the leading end (outer peripheral end edge) of the flange 70 is inclined or curved obliquely upward (alternate long and short dash line is a line segment that is obtained by extending the lower surface of the flange 70), and the pressing portion 72 in the base portion of the flange 70 abuts on the upper surface of the solder resist 67. Therefore, the thickness of the space between the lower surface of the flange 70 and the plating layer 82 on the ground electrode 57 can be increased larger than the thickness of the solder resist 67. As a result, the thickness of the conductive joining member 73 can be increased to enhance the joining strength of the conductive cap 54.

In the third embodiment, the solder resist 67 with which the ground electrode 57 is coated may also be eliminated. Because the flange 70 is inclined or curved, even if the pressing portion 72 in the base portion of the flange 70 directly abuts on the ground electrode 57, the space (gap) is generated between the outer peripheral portion of the flange 70 and the ground electrode 57, and the space can be filled with the conductive joining member 73 to join the conductive cap 54 to the board 52.

(Fourth Embodiment)

Figure 16:
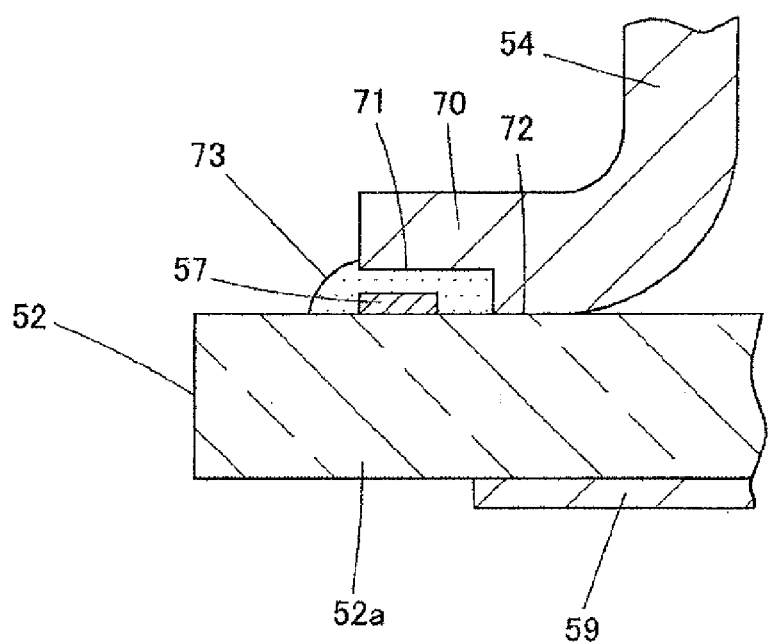
FIG. 16 is a sectional view illustrating a structure of an electronic component according to a fourth embodiment of the invention.

FIG. 16 is a sectional view illustrating a structure of an electronic component according to a fourth embodiment of the invention. The conductive cap 54, in which the recess 71 and the pressing portion 72 are formed in the flange 70, is used in the fourth embodiment. The pressing portion 72 of the conductive cap 54 abuts on the surface of the insulating plate 52a on the inside of the ground electrode 57. On the outer peripheral side of the abutment portion, the inner surface of the recess 71 and the board 52 are joined by the conductive joining member 73 that is applied such that the ground electrode 57 is coated therewith.

(Modification of Fourth Embodiment)

Figure 17:
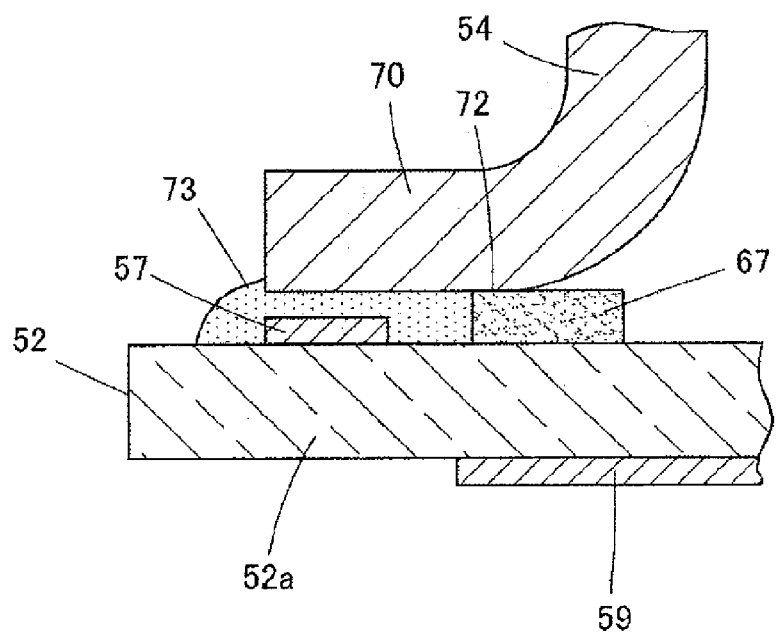
FIG. 17 is a sectional view illustrating part of an electronic component according to a modification of the fourth embodiment.

FIG. 17 is a sectional view illustrating part of an electronic component according to a modification of the fourth embodiment. In the modification, the solder resist 67 is formed in the upper surface of the insulating plate 52a while separated from the ground electrode 57 on the inner peripheral side of the ground electrode 57. The solder resist 67 is formed into a ring shape so as to be parallel with the ground electrode 57. The pressing portion 72 in the base portion of the flange 70 abuts on the upper surface of the solder resist 67, and the pressing portion 72 and the board 52 are joined by the conductive joining member 73 that is applied such that the ground electrode 57 is coated therewith on the outer peripheral side of the solder resist 67.

(Fifth Embodiment)

Figure 18:
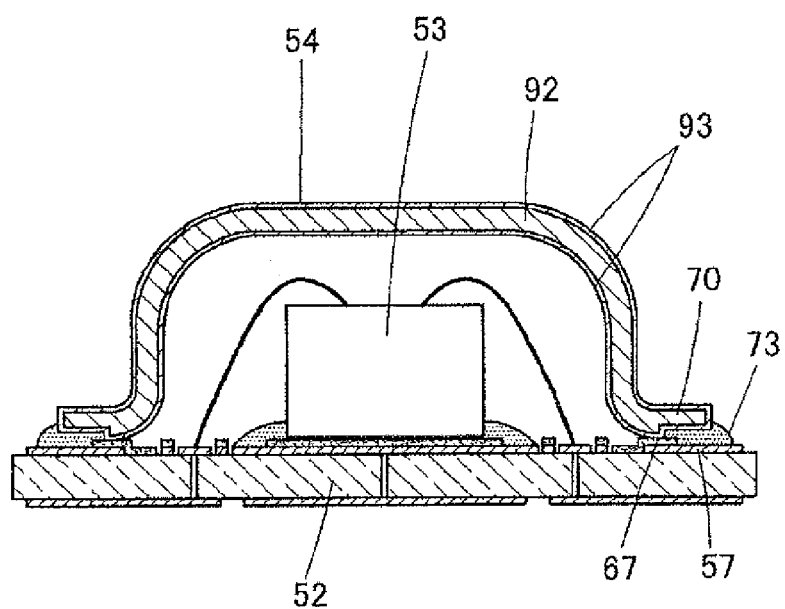
FIG. 18 is a sectional view illustrating a structure of an electronic component according to a fifth embodiment of the invention.

FIG. 18 is a sectional view illustrating a structure of an electronic component according to a fifth embodiment of the invention. In an electronic component 91 of the fifth embodiment, using resin (for example, liquid crystal polymer), the conductive cap 54 is formed by coating the whole surface (outer surface and inner surface) of a cap body 92 that is of a resin molding product molded into a cap shape with a conductive film 93 (for example, single-layer or multi-layer plating film).

Although not illustrated, the conductive film 93 may be provided in the cap body 92 over the whole surface of the cap body 92. In such cases, part of the conductive film 93 may be exposed to the lower surface of the flange 70 to establish the electric conduction with the ground electrode 57.

(Sixth Embodiment)

Figure 19:
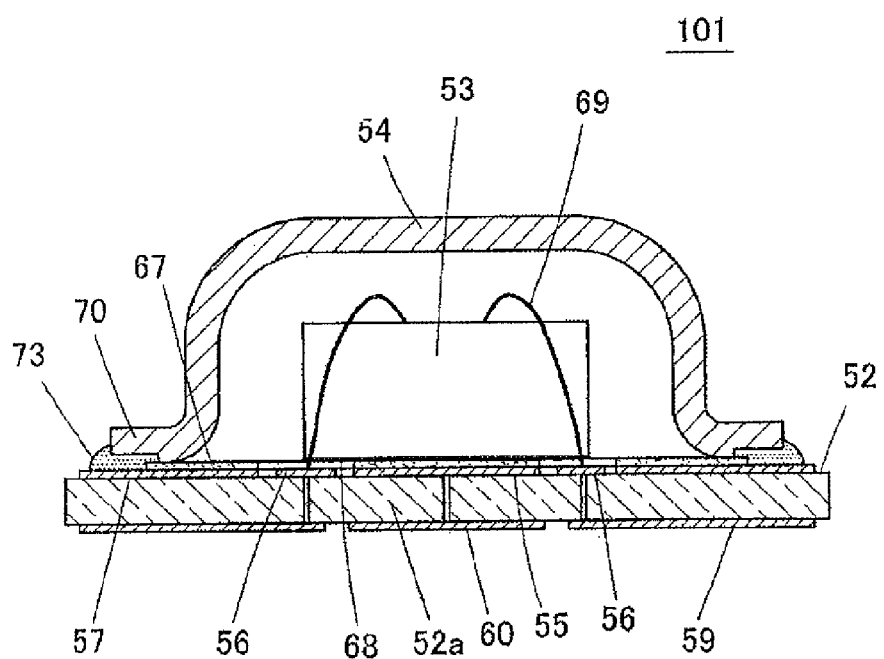
FIG. 19 is a sectional view illustrating a structure of an electronic component according to a sixth embodiment of the invention.
Figure 20:
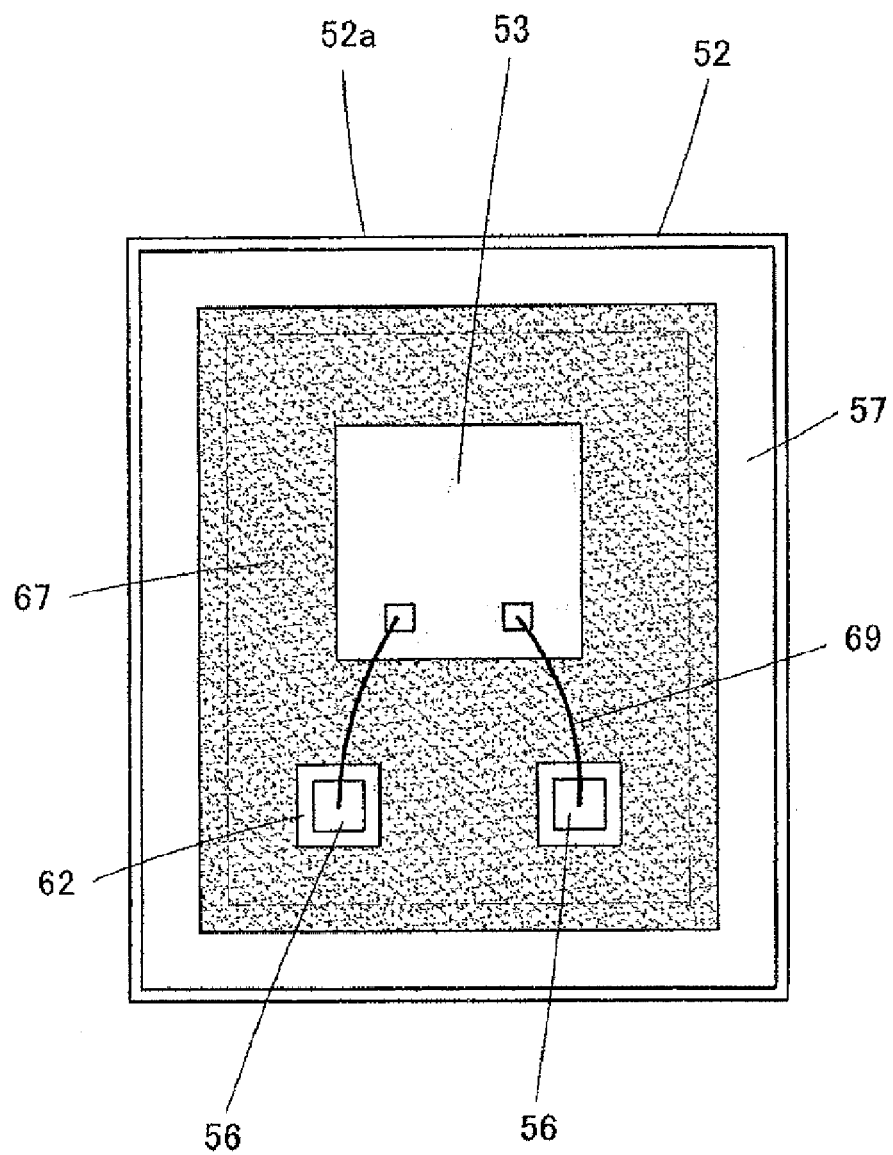
FIG. 20 is a plan view illustrating a board of the electronic component of the sixth embodiment.
Figure 21:
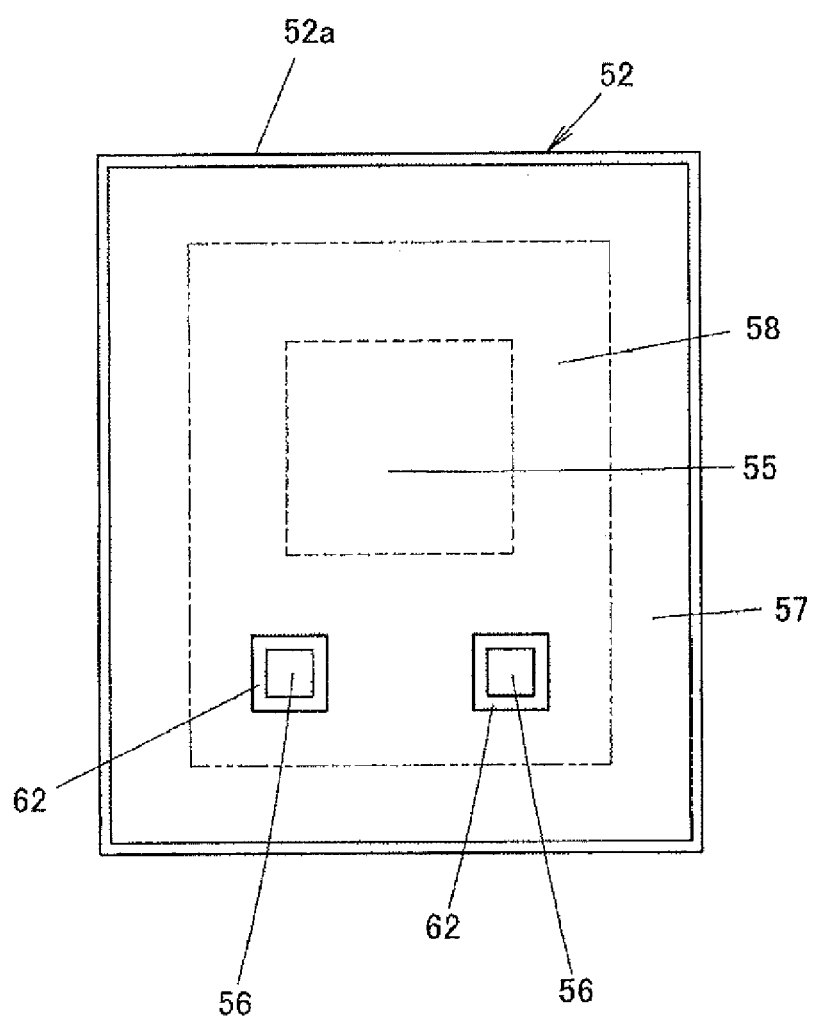
FIG. 21 is a plan view of a state in which the solder resist is removed from the board.

FIG. 19 is a sectional view illustrating a structure of an electronic component according to a sixth embodiment of the invention. FIG. 20 is a plan view illustrating the board 52 on which the semiconductor element 53 is mounted, FIG. 21 is a plan view illustrating the board 52 before the solder resist 67 is formed. In the board 52 used in an electronic component 101 of the sixth embodiment, as illustrated in FIG. 21, the island portion 55, the surface-side ground pattern 58, and the ground electrode 57 are integrally formed. That is, the grooves 61 and 63 of the first embodiment are eliminated. As a result, only the pad 56 is separated by the groove 62. Therefore, as illustrated in FIG. 20, the solder resist 67 is formed in the whole of the metallic thin film region except the outer peripheral portion (region to which the conductive joining member 73 is applied) of the ground electrode 57 and the pad 56.

(Seventh Embodiment)

Figure 22:
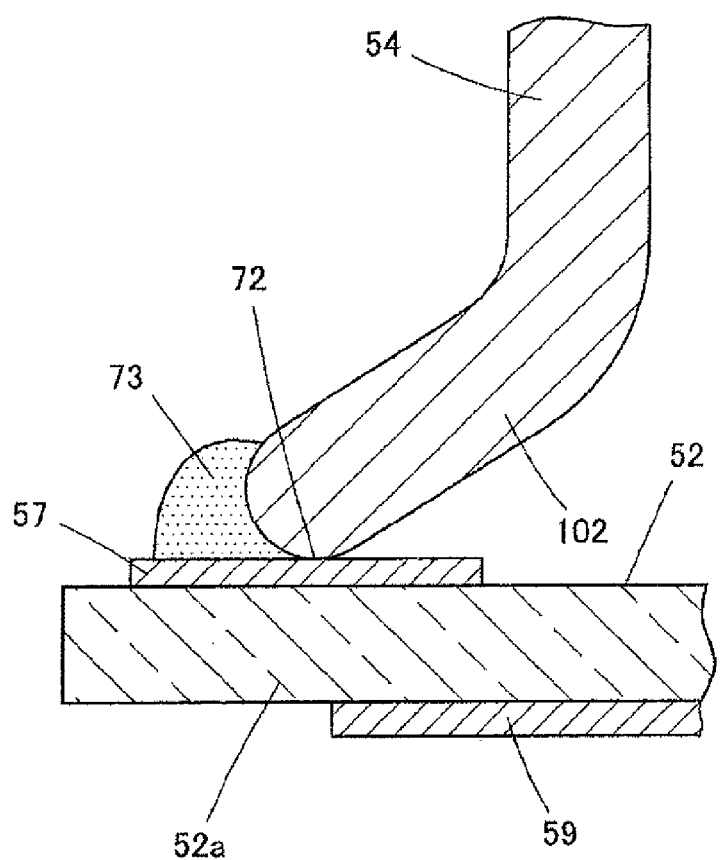
FIG. 22 is a partially sectional view illustrating a structure of an electronic component according to a seventh embodiment of the invention.

FIG. 22 is a partially sectional view illustrating a structure of an electronic component according to a seventh embodiment of the invention. In the seventh embodiment, a bent portion 102 is provided while the lower end portion of the conductive cap 54 is slightly bent of curved toward the outer peripheral side, and the lower surface in the leading end portion of the bent portion 102 constitutes the pressing portion 72. In the sixth embodiment, the horizontal flange 70 does not exist, and the sufficiently long region does not exist on the outer peripheral side of the pressing portion 72. However, in such cases, as illustrated in FIG. 22, the conductive joining member 73 can be retained between the ground electrode 57 and the leading end surface of the bent portion 102 on the outer peripheral side of the pressing portion 72 to join the conductive cap 54 to the ground electrode 57.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An electronic component comprising:
a board;
a semiconductor element mounted on an upper surface of the board;
a ground electrode formed in a region surrounding the semiconductor element on the upper surface of the board;
a conductive cap that overlaps the board such that the semiconductor element is covered therewith; and
a conductive joining member that joins a whole periphery of a lower surface of the conductive cap to the ground electrode,
wherein the conductive cap includes a pressing portion on the lower surface thereof, and the lower surface of the conductive cap and the ground electrode are joined by the conductive joining member on an outer peripheral side of the pressing portion, and
wherein a portion of the ground electrode is coated with a coating member, a portion of the ground electrode is exposed from the coating member on the outer peripheral side of the portion coated with the coating member, and the pressing portion is provided in an upper surface of the coating member.

2. An electronic component comprising:
a board;
a semiconductor element mounted on an upper surface of the board;
a ground electrode formed in a region surrounding the semiconductor element on the upper surface of the board;
a conductive cap that overlaps the board such that the semiconductor element is covered therewith; and
a conductive joining member that joins a whole periphery of a lower surface of the conductive cap to the ground electrode,
wherein the conductive cap includes a pressing portion on the lower surface thereof, and the lower surface of the conductive cap and the ground electrode are joined by the conductive joining member on an outer peripheral side of the pressing portion, and
wherein the lower surface of the conductive cap is sunk in upward further than the pressing portion on the outer peripheral side of the pressing portion of the conductive cap lower surface.

3. An electronic component comprising:
a board;
a semiconductor element mounted on an upper surface of the board;
a ground electrode formed in a region surrounding the semiconductor element on the upper surface of the board;
a conductive cap that overlaps the board such that the semiconductor element is covered therewith; and
a conductive joining member that joins a whole periphery of a lower surface of the conductive cap to the ground electrode,
wherein the conductive cap includes a pressing portion on the lower surface thereof, and the lower surface of the conductive cap and the ground electrode are joined by the conductive joining member on an outer peripheral side of the pressing portion, and
wherein a gap between the lower surface of the conductive cap and the ground electrode is gradually increased toward the outer peripheral side of the pressing portion.

4. The electronic component according to claim 2, wherein the pressing portion is provided in an upper surface of the ground electrode.

5. The electronic component according to claim 3, wherein the pressing portion is provided in an upper surface of the ground electrode.

* * * * *